US011487040B2

(12) United States Patent
Liu et al.

(10) Patent No.: US 11,487,040 B2
(45) Date of Patent: Nov. 1, 2022

(54) MULTI-FREQUENCY TUNING NETWORK SYSTEM AND METHOD

(71) Applicant: Baker Hughes Oilfield Operations LLC, Houston, TX (US)

(72) Inventors: Yi Liu, Houston, TX (US); Stanislav Wilhelm Forgang, Houston, TX (US); John Jones, Houston, TX (US); Carlos Rivero, Houston, TX (US); Louis Perez, Houston, TX (US); Fei Le, Houston, TX (US); Babak Kouchmeshky, Houston, TX (US); Yinxi Zhang, Houston, TX (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 185 days.

(21) Appl. No.: 16/915,491

(22) Filed: Jun. 29, 2020

(65) Prior Publication Data

US 2021/0405239 A1   Dec. 30, 2021

(51) Int. Cl.
| | |
|---|---|
| *G01V 3/30* | (2006.01) |
| *H01Q 9/04* | (2006.01) |
| *H03J 3/22* | (2006.01) |
| *E21B 47/12* | (2012.01) |

(52) U.S. Cl.
CPC ............... *G01V 3/30* (2013.01); *E21B 47/12* (2013.01); *H01Q 9/04* (2013.01); *H03J 3/22* (2013.01)

(58) Field of Classification Search
CPC ............. G01V 3/30; E21B 47/12; H01Q 9/04
See application file for complete search history.

(56) References Cited

U.S. PATENT DOCUMENTS

| | | |
|---|---|---|
| 4,609,887 A | 9/1986 | Taralp |
| 6,600,449 B2 | 7/2003 | Onaka et al. |
| 6,603,309 B2 | 8/2003 | Forgang et al. |
| 6,825,659 B2 | 11/2004 | Prammer et al. |
| 7,088,104 B2 | 8/2006 | Bottomley |
| 7,109,457 B2 | 9/2006 | Kinzer et al. |
| 7,482,887 B2 | 1/2009 | Cyr et al. |
| 7,602,345 B2 | 10/2009 | Chominski |
| 7,936,171 B2 | 5/2011 | Hu et al. |
| 8,000,737 B2 | 8/2011 | Caimi et al. |
| 8,368,483 B2 | 2/2013 | Fukuda et al. |

(Continued)

OTHER PUBLICATIONS

Alexey A Tyshko, "Development of Nuclear Magnetic Resonance Downhole Logging Tool for Hydrocarbones Search," VGTU leidykla TECHNIKA, 2016, pp. 1-130.

(Continued)

*Primary Examiner* — Alvaro E Fortich
(74) *Attorney, Agent, or Firm* — Hogan Lovells US LLP

(57) ABSTRACT

A multi-frequency tuning circuit includes a first branch including a first inductor and a first capacitor arranged in series and a second branch including a second inductor and a second capacitor arranged in series. The circuit is arranged within a circuitry module configured to be positioned between a source and a load, the first branch and the second branch both associated with loads, from the source, having low impedance frequencies. In order to improve transmitter antenna output power for downhole tools, the tuning circuit creates high impedance at operating frequencies between frequencies corresponding to low impedance.

13 Claims, 12 Drawing Sheets

(56) References Cited

U.S. PATENT DOCUMENTS

| | | | |
|---|---|---|---|
| 8,797,219 B2 | 8/2014 | Ko et al. | |
| 9,069,098 B2 | 6/2015 | Hopper et al. | |
| 9,133,707 B2 | 9/2015 | Prammer | |
| 9,201,159 B2 | 12/2015 | Morys et al. | |
| 9,506,332 B2 | 11/2016 | Saeedfar | |
| 9,537,198 B2 | 1/2017 | Seneviratne et al. | |
| 9,577,602 B2 | 2/2017 | Martiskainen | |
| 2010/0283468 A1* | 11/2010 | Signorelli | G01V 3/28 343/866 |
| 2012/0051189 A1* | 3/2012 | Signorelli | G01V 3/12 367/177 |
| 2012/0182089 A1 | 7/2012 | Liang | |
| 2012/0274517 A1* | 11/2012 | Nagoshi | H01Q 5/357 343/700 MS |
| 2015/0002156 A1 | 1/2015 | Leussler et al. | |
| 2016/0187521 A1 | 6/2016 | Homan et al. | |
| 2018/0138992 A1 | 5/2018 | Kraft et al. | |
| 2019/0068142 A1 | 2/2019 | Tsutsui | |
| 2019/0226330 A1* | 7/2019 | Xiao | E21B 47/16 |
| 2019/0356284 A1* | 11/2019 | Zhu | H03F 3/245 |

OTHER PUBLICATIONS

Vishwanath Iyer, "Broadband Impedance Matching of Antenna Radiators," Worcester Polytechnic Institute, Aug. 2010, pp. 1-204.
International Search Report and Written Opinion dated Oct. 5, 2021 in corresponding PCT Application No. PCT/US21/39382.

* cited by examiner

MULTI-FREQUENCY TUNING NETWORK SYSTEM AND METHOD

BACKGROUND

1. Field of the Disclosure

The present disclosure relates to a system and method for tuning and/or adjusting power output for a tool, such as a downhole logging tool. More specifically, the present disclosure is directed towards systems and methods for determining and creating high impedances at desired frequencies to improve transmitter antenna output power for downhole tools.

2. Description of Related Art

Oil and gas production may involve downhole measurement operations where various sensors are utilized to collect data for determining one or more wellbore properties. In dielectric services, one or multiple transmitter antennas are used to generate transmit signals in form of electromagnetic waves generated in radio frequencies, and receiver antennas are used to detect these signals, which propagate through downhole formations. The transmitter and receiver antennas are typically of induction type with a radiation pattern close to the radiation pattern of magnetic dipole. Power amplifiers (PA) are used to power the transmitter antennas and in order to get the maximum transmitter output, typically, the PA source impedance needs to match the antenna load impedance at operation frequencies. The antenna load impedance depends on the operating frequencies and radiation impedance, which is largely determined by power losses in the formation. Typically antenna load impedance is not equal to the source impedance, which makes it difficult for a transmitter antenna to transmit high power at multiple frequencies.

SUMMARY

Applicant recognized the limitations with existing systems herein and conceived and developed embodiments of systems and methods, according to the present disclosure, for improving antenna transmission power at multiple desired frequencies by implementing a tuning circuit for downhole tools.

In an embodiment, a multi-frequency tuning circuit includes a first branch including a first inductor and a first capacitor arranged in series and a second branch including a second inductor and a second capacitor arranged in series. The circuit is arranged within a circuitry module configured to be positioned between a high frequency power source and an antenna, A source of high frequency electric power such as a generator, power amplifier, or transmitter has a source impedance which is equivalent to an electrical resistance in series with a reactance. An electrical load, such as an antenna, similarly has an impedance, which is typically equivalent to a resistance in series with a reactance. From the source point of view, the load input impedance is equal to the input impedance associated with the tuning circuit. The first branch and the second branch both associated with loads, from the source, have low impedances at first and second resonant frequencies respectively, where a high impedance can be created between them. Tuning the high impedance to a desired frequency, using embodiments of the present disclosure, enables effective operation of the circuit.

In an embodiment, a system for tuning a frequency includes an antenna, a source for providing operational energy to the antenna, and a tuning circuit positioned between the antenna and the source, the tuning circuit configured to identify one or more high impedance operational frequencies for the antenna. The tuning circuit includes a first branch including a first inductor and a first capacitor arranged in series and a second branch including a second inductor and a second capacitor arranged in series.

In an embodiment, a method for selecting and/or generating an operational frequency includes positioning a tuning circuit between a source and an antenna. The method also includes applying a first load to a first branch of the tuning circuit. The method further includes determining a first impedance of the first branch at the first load. The method also includes applying a second load to a second branch of the tuning circuit. The method includes determining a second impedance of the second branch at the second load. The method also includes identifying a peak between the first impedance and the second impedance, the peak having a peak impedance greater than both the first impedance and the second impedance and being at a peak frequency. The method further includes adjust the tuning circuit to enable transmission at a selected frequency within a range of the peak frequency.

In an embodiment, a multi-frequency tuning circuit includes a first branch including a first inductor and a first capacitor arranged in series and a second branch including a second inductor and a second capacitor arranged in series. The circuit is arranged within a circuitry module configured to be positioned between a source and a load, the first branch and the second branch both associated with loads, from the source, having low impedance frequencies.

In an embodiment, a system for tuning a frequency includes an antenna, a source for providing operational energy to the antenna, and a tuning circuit positioned in series between the antenna and the source, the tuning circuit configured to identify one or more high impedance operational frequencies for the antenna. The tuning circuit includes a first branch including a first inductor and a first capacitor arranged in series and a second branch including a second inductor and a second capacitor arranged in series.

In an embodiment, a method for selecting an operational frequency includes positioning a tuning circuit between a source and an antenna. The method also includes applying a first load to a first branch of the tuning circuit. The method further includes determining a first impedance of the first branch at the first load. The method also includes applying a second load to a second branch of the tuning circuit. The method further includes determining a second impedance of the second branch at the second load. The method includes identifying a peak between the first impedance and the second impedance, the peak having a peak impedance greater than both the first impedance and the second impedance and being at a peak frequency. The method also includes tuning the tuning circuit to operate at a selected frequency within a range of the peak frequency.

BRIEF DESCRIPTION OF DRAWINGS

The present technology will be better understood on reading the following detailed description of non-limiting embodiments thereof, and on examining the accompanying drawings, in which.

DETAILED DESCRIPTION

Figure 1:
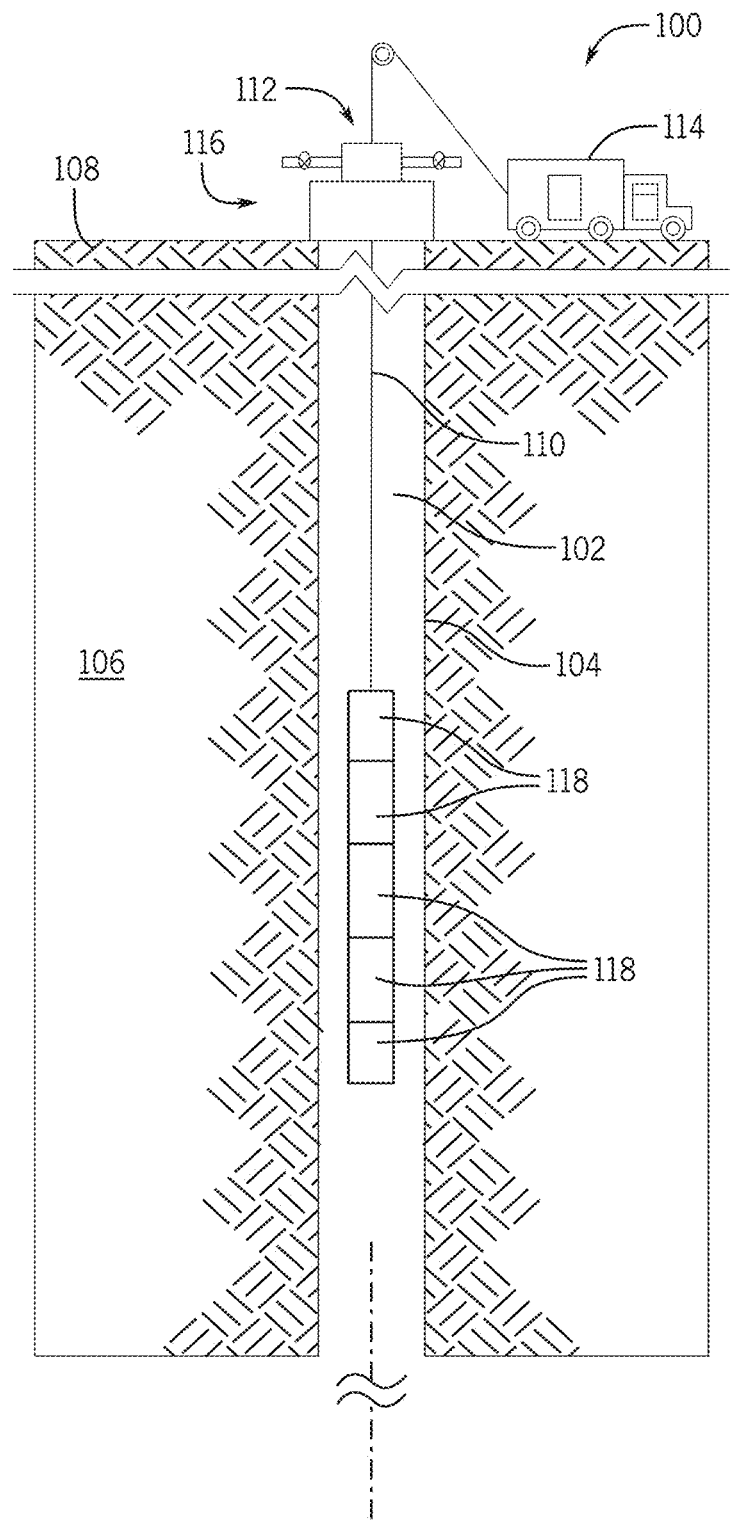
FIG. 1 is a cross-sectional side view of an embodiment of an wellbore system, in accordance with embodiments of the present disclosure.

The foregoing aspects, features, and advantages of the present disclosure will be further appreciated when considered with reference to the following description of embodiments and accompanying drawings. In describing the embodiments of the disclosure illustrated in the appended drawings, specific terminology will be used for the sake of clarity. However, the disclosure is not intended to be limited to the specific terms used, and it is to be understood that each specific term includes equivalents that operate in a similar manner to accomplish a similar purpose. Additionally, references numerals may be reused for similar features between figures, however, such use is not intended to be limiting and is for convenience and illustrative purposes only.

When introducing elements of various embodiments of the present disclosure, the articles "a", "an", "the", and "said" are intended to mean that there are one or more of the elements. The terms "comprising", "including", and "having" are intended to be inclusive and mean that there may be additional elements other than the listed elements. Any examples of operating parameters and/or environmental conditions are not exclusive of other parameters/conditions of the disclosed embodiments. Additionally, it should be understood that references to "one embodiment", "an embodiment", "certain embodiments", or "other embodiments" of the present disclosure are not intended to be interpreted as excluding the existence of additional embodiments that also incorporate the recited features. Furthermore, reference to terms such as "above", "below", "upper", "lower", "side", "front", "back", or other terms regarding orientation or direction are made with reference to the illustrated embodiments and are not intended to be limiting or exclude other orientations or directions.

Embodiments of the present disclosure are directed toward a method of impedance tuning including networks having inductors and capacitors combined in parallel and series configuration to increase a magnetic field radiated by induction transmitter antennas and receiver induction antenna efficiencies for a dielectric logging tool.

Induction (loop type) antennas are not widely used in commercial applications due to their lower intrinsic efficiency compared with conventional E-field antennas and complexity in tuning. Their radiated magnetic field is directly proportional to the antenna current and thus requires tuning the antenna in resonance to maximize it. In microwave applications, a traditional matching or tuning induction antennas with serially connected conjunction impedances becomes very difficult. Primary reasons for this is a need to use loops with limited number of turns and with small dimensions to avoid having its intrinsic resonances within operating frequency range (shields between turns helps, but always reduces maximum operating frequency). Additionally, small of dimensions, and as a result, small inductance, the antenna suffers any parasitic elements which might have links to its terminal and, primarily, construction capacitance, coupling between traces, reactance of the drivers, name a few.

Another drawback for traditional series matching is a need to drive antenna with high current from the source. This option, regardless of implementation, would result in elevated heat losses in active elements, which is very undesirable in downhole tools. Therefore, the preferable mode of operation has been tuning induction antenna in parallel resonance and arrangement tuning tank in such a way that it has sufficiently high electrical quality Q. Examples include LWD propagation resistivity tools, NMR logging tools, etc. When parallel tank tuning had been provided in this way, the antenna's current could be maximized by a voltage applied to the tank while the required source current becomes in Q times less than the antenna's one. To preserve tanks' high electrical quality and avoid its damping, the output conductance of tuning circuit should not have a significant conductance (i.e., small in value real part of output impedance connected parallel to the tank). Power amplifiers (Pas) usually have a significant real component of their output conductance and thus the link between PA and antennas should predominantly have been built with reactive elements and be of high impedance (to decouple PA).

The transmitter antenna is powered by broadband PAs. Currently, if high antenna current is required, those PAs, traces, and other components on the PCB could generate an unwanted radiation field and cause electric noises. The input impedance, the total impedance of the tuning network in series with the antenna, are at or near maximum at targeted frequencies, which limits the current from the PA to the transmitter antenna, minimizes the electronic noises, and improves the signal to noise ratio (SNR) of the logging tool. The tuning network creates bandpasses centered at designed frequencies, which also clean up the transmission and receiving signals from those targeted frequencies, and further improves the SNR of the logging tool.

Embodiments of the present disclosure include a tuning network to work at high impedance mode with a multi-frequency microwave power source. This network is arranged as a parallel circuit, where each branch is made of series of inductors or capacitors (LC circuit). Each branch has its own resonant frequency at which the tuning network exhibits low impedance. Between every two neighboring frequencies corresponding to impedance frequencies (e.g., shorts, two frequencies corresponding to low impedance), there is another frequency at which impedance is high. The set of frequencies, which result in high impedance, may be used as operating frequencies. Embodiments drive the load in the parallel resonance LC tank mode, achieving high impedance for the load at designed frequencies. Accordingly, various embodiments may provide benefits over existing matching networks, including but not limited to having multiple frequency matching with an easy design, achieving good power transfer for all frequencies, and lowering the current because of high impedance.

FIG. 1 is a schematic cross-sectional view of an embodiment of a wellbore system 100 including a downhole tool 102 arranged within a wellbore 104 formed in a formation 106. The downhole tool 102 is lowered from a surface location 108 via a conveyance system, such as the illustrated wireline 110. In various embodiments, the electric wireline may transmit electric signals and/or energy from the surface location 108 into the wellbore, for example to provide operational power for the tool 102 and/or to transmit data, such as data obtained from sensors arranged on the tool 102. In various embodiments, the tool 102 may be utilized to perform downhole logging operations, such as an imaging tool, a resistivity tool, a nuclear tool, or any other logging tool that may be used in a downhole environment. It should be appreciated that embodiments exist where the downhole tool 102 is deployed with any other type of conveyance means, including coiled tubing, pipes, cable, and slickline. That is, embodiments of the present disclosure may be utilized in other scenarios, such as measurement while drilling, production logging, and the like.

The wellbore system 100 includes a wellhead assembly 112, shown at an opening of the wellbore 104, to provide pressure control of the wellbore 104 and allow for passage of equipment into the wellbore 104, such as the cable 110 and the tool 102. In this example, the cable 110 is a wireline being spooled from a service truck 114. The wellhead assembly 112 may include a blowout preventer (BOP) 116 (e.g., pressure control device).

In various embodiments, the downhole tool 102 includes a number of segments 118, which may represent different devices or sensors utilized to obtain information from the downhole environment. By way of example only, one segment may be related to dielectric services that include one or more antennas in order to generate transmit signals in radio frequencies and to detect signals. A power amplifier (PA) may drive the transmitter antenna. It is desirable to match the load impedance of the transmitted antenna to the source impedance at operation frequencies. However, this may be challenging to accomplish, and in various embodiments may lead to one or more adjustments. Traditional matching circuits have numerous drawbacks. For example, certain networks may include a switch with multiple matching networks, where each network is set for a particular, single frequency. The switch may not support high enough power, among other deficiencies, such as have particular frequency ranges for the various networks. In other traditional networks, attenuators could be used for matching the PA. However, the attenuators my not enhance the antenna signal levels at targeted frequencies, and the electric current is very high, which is not efficient for the PA and causes noise and overheating its active components. Furthermore, a complex LC network could be used to match the impedance at designed frequencies, where PA source impedance is equal to input impedance, but the tolerance of error is small and hard to find the components, such as inductor and capacitor, with right values to work at high frequencies, for example 500 MHz, or 1 GHz. Embodiments of the present disclosure overcome these drawbacks and provide an improved tuning network, which may be utilized with downhole tools.

Figure 2B:
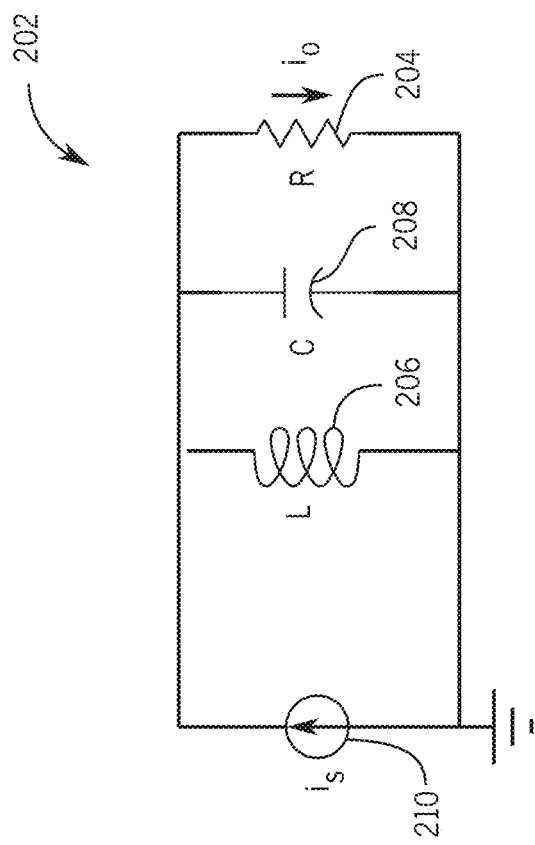
FIGS. 2A-2D are circuit diagrams illustrating resistor, capacitor, and inductor circuits.
Figure 2A:
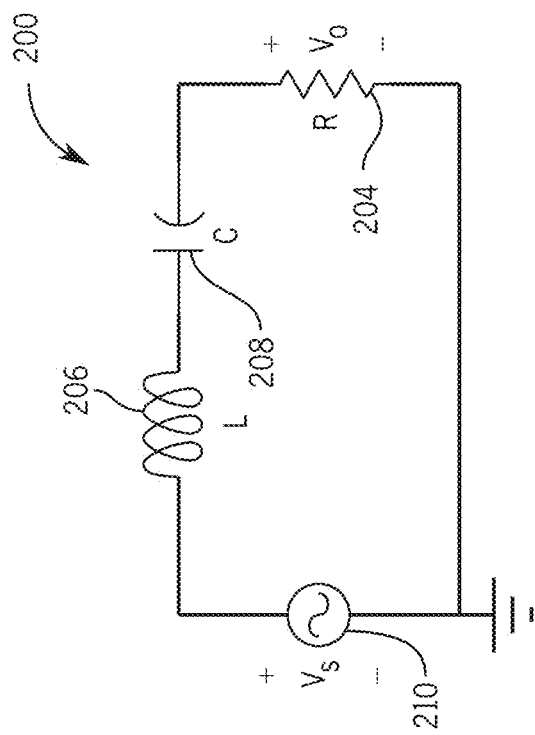

FIGS. 2A and 2B are prior art circuit diagrams illustrating series 200 (FIG. 2A) and parallel (FIG. 2B) RLC circuits 202. The illustrated circuits 200, 202 each include a resistor 204, an inductor 206, and a capacitor 208. The circuits 200, 202 further illustrate a load 210 (voltage for the series RLC circuit 200 and current for the parallel RLC circuit 202). Both circuits have resonant frequencies expressed in Equation 1.

$$f = \frac{1}{2\pi\sqrt{LC}} \qquad \text{Equation 1}$$

The impedance of the series RLC circuit 200 is minimal at resonance, in contrast, the impedance of the parallel RLC circuit 202 is maximal. At parallel resonance, the both inductor 206 and capacitor 208 has high current of Q times of source current, where Q is resonant quality factor, and the resistor 204 has the maximum current, which is equal to the source current.

Figure 2D:
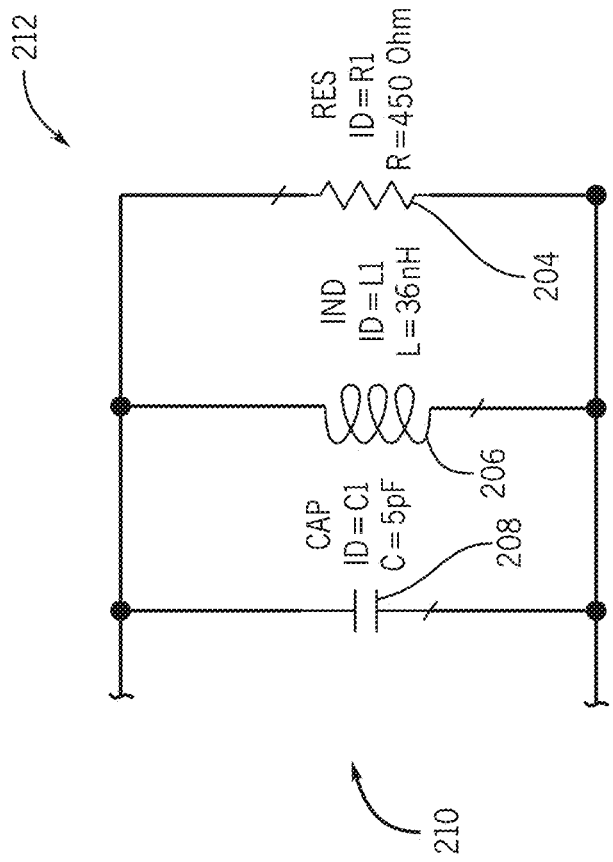
Figure 2C:
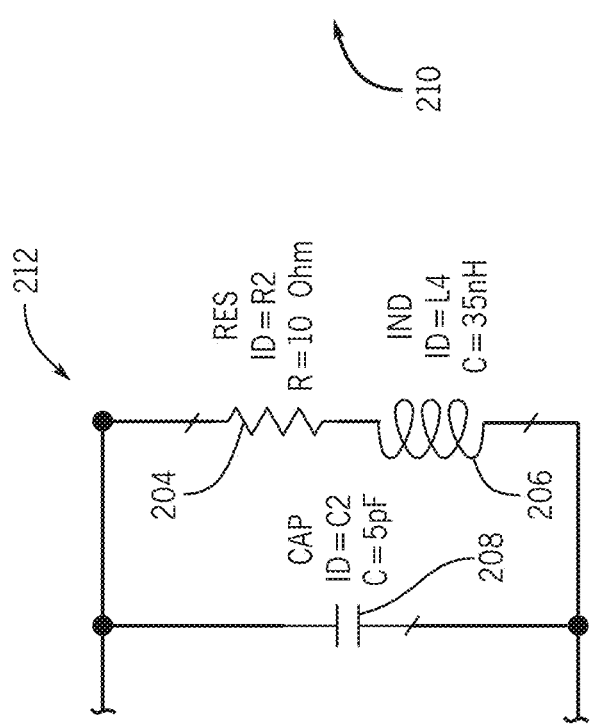

FIGS. 2C and 2D are circuit diagrams illustrating approximated models of antenna 212. In these examples, the antenna 212 can be described approximately by a simple circuit (FIG. 2C), where the capacitor 208 is distributed capacitance, the inductor 206 is antenna loop inductance, and the resistor 204 is the sum of total radiation loss and antenna resistance. This circuit can be further transformed to a parallel RLC circuit (FIG. 2D). However, it should be appreciated that FIGS. 2C and 2D are for illustrative purposes only. For example, the equivalent resistance/inductance in the parallel circuit of FIG. 2D is not same as in FIG. 2C. Depending on the operating frequency, for example at 300 MHz, the equivalent resistor and inductor in FIG. 2D is 450 ohm and 36 nH, which will be same effect as in FIG. 2C, where the series resistor is 10 ohm and inductor is 35 nH. As mentioned above, the antenna loop inductor has the highest current at parallel resonance, which gives the maximum transmit power for antenna.

In operation, when RF circuits contain components that do not have matched impedances, designers may typically either modify the components or add circuitry to correct the mismatch. Replacing or modifying the components is undesirable and often impractical (e.g., costs, operating conditions, etc.) and as a result, circuitry is generally utilized to correct differences in impedances between components to enable proper impedance matching by transforming the impedance relationship between source and load. Typically, a matching network is connected between a source and a load, and its circuitry is usually designed such that it transfers max power to the load while presenting an input impedance that is equal to the complex conjugate of the source's output impedance.

The current matching techniques have difficulties in matching more than one or two operating frequencies and difficult component selection and configurations. In contrast, embodiments of the present disclosure method can create parallel resonances at every targeted frequency for the induction antenna systematically.

Figure 2E:
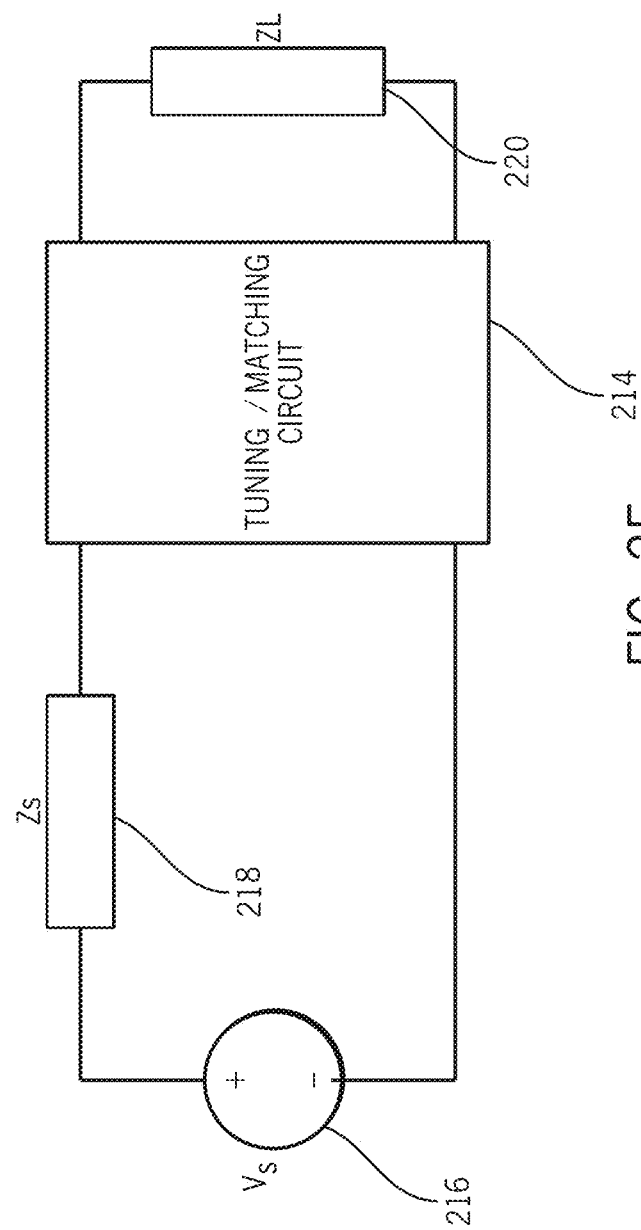
FIG. 2E is a circuit diagram illustrating a tuning circuit.

FIG. 2E is a schematic diagram of an embodiment of a circuit, which may include the circuitry described above with respect to FIGS. 2A-2D. In the illustrated embodiment, the circuit includes a source 216 and a source impedance 218 along with a load impedance 220. Arranged between the respective impedances 218, 220 is a tuning circuit 214, which may be utilized to match the source impedance 218 and the load impedance 220 at resonant frequencies, thereby increasing power output.

Figure 3:
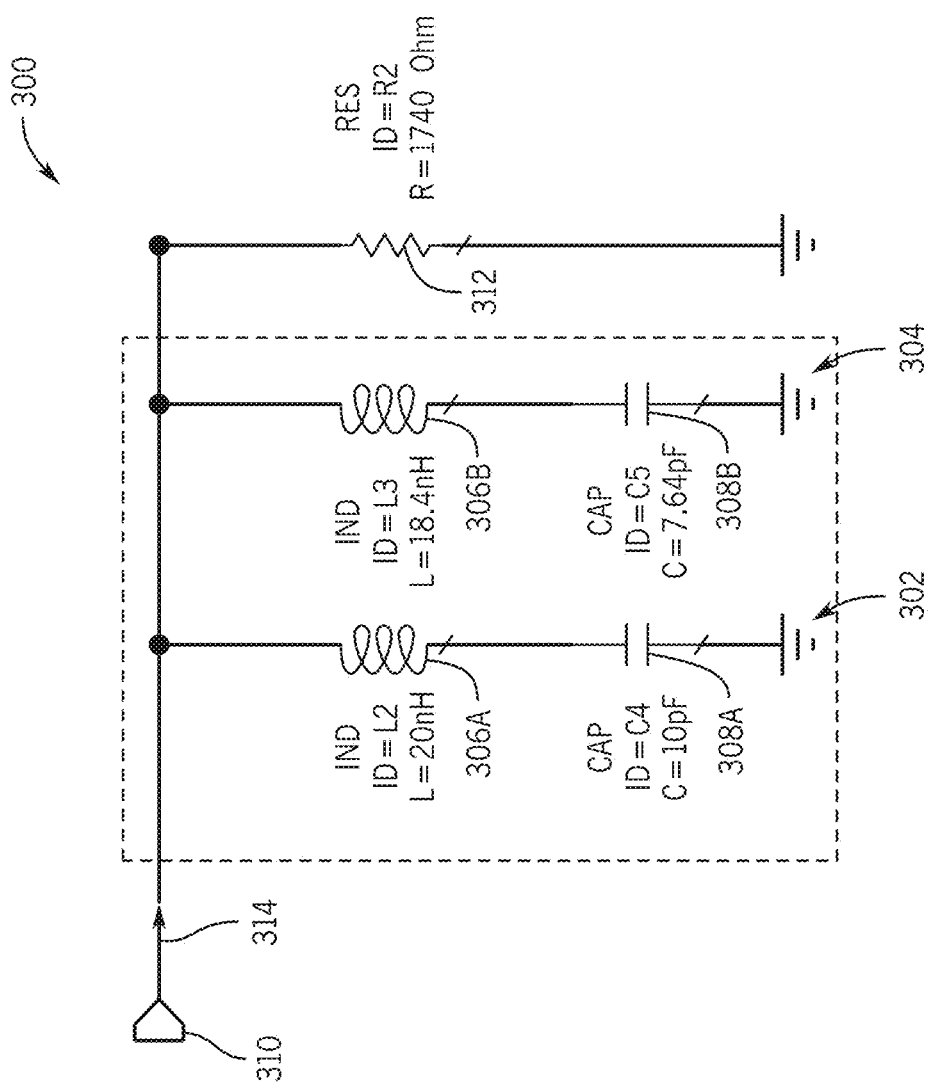
FIG. 3 is a schematic diagram of an embodiment of tuning circuitry, in accordance with embodiments of the present disclosure.

FIG. 3 is a schematic diagram of an embodiment of a tuning circuit 300, which may be utilized with downhole tools in order to determine a frequency for high impedance antenna operation. It should be appreciated that various aspects of the circuit 300 described below may be particularly selected for a variety of different tool properties, and as a result, references to particular values are for illustrative purposes only and not intended to limit the scope of the present disclosure. The illustrated tuning circuit 300 may be utilized to identify a high tank impedance resonance for antenna operation.

Embodiments of the present disclosure include a first branch 302 and a second branch 304. Each branch 302, 304 includes an inductor 306 and a capacitor 308 arranged in series. For clarity, the inductor 306 and capacitor 308 may be referred to as an LC or LC circuit. The illustrated circuit 300 is coupled between a source 310 and antenna impedance 312, which may represent an antenna in this embodiment. The collection of circuitry in FIG. 3 may also be referred to as an antenna circuitry. It should be appreciated that the tuning circuit 300 may be as standalone component or module that may be coupled between the source 310 and the impedance Z 312. However, it should be appreciated that the tuning circuit 300 may also be integrated into the antenna circuitry. In various embodiments, the impedance Z may be representative of general impedance, such as by Equation 2, $$Z = R + jX \qquad \text{Equation 2}$$

where the real part of the impedance Z is the resistance R and the imaginary part is the reactance X. The imaginary unit is j.

It should be appreciated that various embodiments may utilize commercial circuit design and modeling software, such as SPICE or software suites offered by AWR Corporation, among other examples, to develop models to determine configurations for the tuning circuit 300. The illustrated branches 302, 304 include at least the LC (e.g., series arrangement of the inductor 306 and the capacitor 308) corresponding to a low impedance in accordance with Equation 1.

Figure 4:
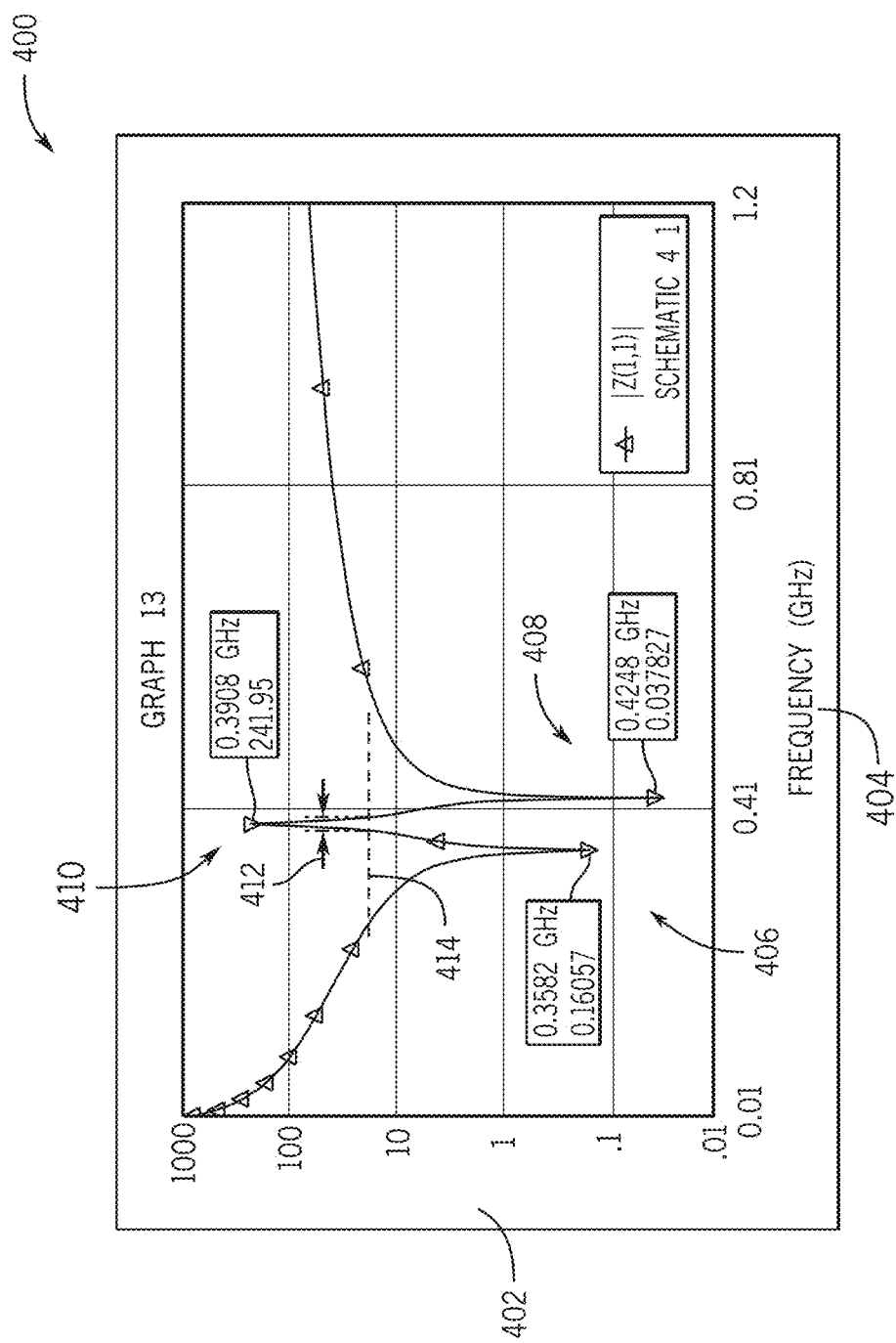
FIG. 4 is a graphical representation of an embodiment of tuning circuitry operation, in accordance with embodiments of the present disclosure.

As will be shown in FIG. 4, between two low impedance dips (e.g., valleys), there is a high impedance over a frequency range, which includes one or more targeting frequencies for the antenna (represented as the resistor 312 in FIG. 3). It should be appreciated that the values associated with the LC circuit components, as well as properties of the antenna, will determine the quality factor (Q) of each resonance.

In the illustrated embodiment, each of the branches 302, 304 is arranged parallel to the antenna 312. In operation, a load 314 is applied across the circuit 300. In certain embodiments, different frequencies may be transmitted simultaneously, in order to determine the impedance for each branch 302, 304. In various operations, the discrete components of each branch, such as the L and C, are adjusted to identify low and high points in a plot that records impedance against frequency. Thereafter, peaks and valleys may be identified in order to select an operating frequency for the antenna. For example, L C values could be determined to achieve peaks and valleys in the impedance spectra and designed frequency for the antenna. In certain embodiments, this process may be performed uphole, for example in a lab setting where different properties may be easily adjusted, and then the circuit 300 may be designed for particular equipment being deployed in the field. However, it should be appreciated that embodiments may also include performing one or more actions in a downhole environment.

These circuits, representative of each of the branches 302, 304 are shown at series resonance, illustrative of a short ($Z \to 0$). However, for a frequency between the frequencies of the respective branches ($\omega_2 > \omega_{peak} > \omega_1$), Equation 3 may be utilized to identify the peak frequency between the valleys representative of the branches 302, 304.

$$\omega_{peak}^2 \sim \frac{C_1 \omega_2^2 + C_2 \omega_1^2}{C_1 + C_2} \qquad \text{Equation 3}$$

In the example shown in FIG. 3, the first branch 302 includes the inductor 306A having an inductance of 20 nH along with a capacitor 308A having a capacitance of 10 pF. The second branch 304 includes the inductor 306B having an inductance of 18.4 nH along with a capacitor 308B having a capacitance of 7.64 pF. The illustrated antenna 312 includes an impedance Z. It should be appreciated that these values are provided for illustrative purposes only.

FIG. 4 is a graphical representation of an embodiment of a plot 400 illustrating impedance versus frequency. The illustrated y-axis 402 corresponds to impedance (Z) in ohms and the x-axis 404 corresponds to frequency (f) in gigahertz (GHz). In the illustrated embodiment, the plot 400 includes values for a load applied to the tuning circuit 300 shown in FIG. 3. As shown, there is a first valley 406, a second valley 408, and a peak 410 positioned between the valleys 406, 408. This peak 410 is representative of a range of frequencies that provides high impedance (e.g., impedance at or above a desirable level). It should be appreciated that operation of the antenna at a frequency within this range may be desirable because such operation enables high transmission while also operating at a low current, which may improve the SNR.

The first valley 406 corresponds to an impedance of approximately 0.16057 ohm with a frequency of approximately 0.3562 GHz in the illustrated embodiment, but as noted above, these numbers are illustrative. The second valley 408 corresponds to an impedance of approximately 0.37827 ohm at a frequency of approximately 0.4284 GHz. As will be appreciated, these frequencies may lead to resonances with the antenna that are too small for reliable transmission or that have a larger current that produces an undesirable SNR. However, as noted above, the peak 410 can be identified between the valleys 406, 408. In the illustrated embodiment, the peak 410 has an impedance of approximately 241.95 ohm at a frequency of 0.3908 GHz. As will be appreciated, the peak 410 of 241.95 is significantly greater than the valleys 406, 408. Furthermore, while the peak 410 has the greatest value, there is a range 412 where impedance is still greater than various surrounding frequencies. For example, a line 414 illustrates an impedance within the range 412. This line 414 illustrates a variety of different frequencies that may be utilized while still providing advantageous performance. As a result, the systems of the present disclosure may be described as having a large tolerance, providing further improvement over existing systems that attempt to "match" frequencies. In contrast, the systems of the present disclosure may provide a range of frequencies, thereby providing a greater range of operation.

Figure 5:
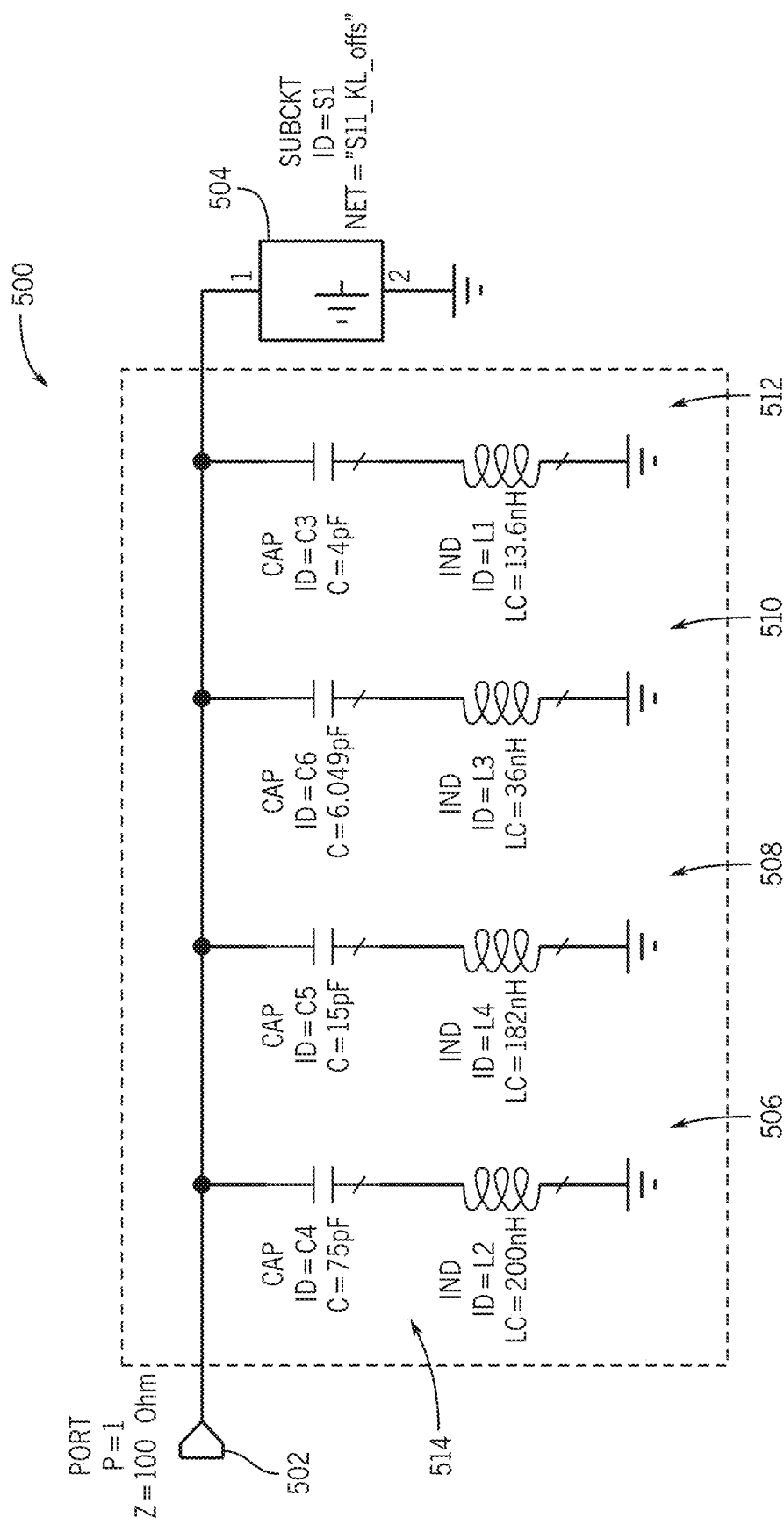
FIG. 5 is a schematic diagram of an embodiment of tuning circuitry, in accordance with embodiments of the present disclosure.

FIG. 5 is a diagram of a tuning circuit 500 (e.g., circuit, multi-frequency tuning circuit) arranged between a load generator 502, such as a PA, and an antenna 504. As will be appreciated, the embodiment in FIG. 5 may be referred to as antenna circuitry including a multi-frequency tuning network because each of the branches may evaluate different frequencies. The illustrated circuit 500 includes four different branches, a first branch 506, a second branch 508, a third branch 510, and a fourth branch 512. Each of the branches 506, 508, 510, 512 are arranged in parallel to each other and to the antenna 504. As described above, in operation, a load may be transmitted through the circuit 500 and to the antenna 504. Resonance is measured at each branch 506, 508, 510, 512 for a variety of different frequencies. In various embodiments, the antenna may be excited at different frequencies simultaneously or sequentially, thereby enabling a determination of the various peaks and valleys associated with the arrangement shown in FIG. 5. It should be appreciated that the four branches 506, 508, 510, 512 are for illustrative purposes only and that, in other embodiments, there may be more or fewer branches. For example, FIG. 3 only included two branches. In various embodiments, there may be one fewer peak than the number of branches, since each peak appears between pairs of the parallel LC circuits 514 in each branch. However, it should also be appreciated that other valleys and peaks may be present corresponding to terminals of the circuit arrangement.

Figure 6:
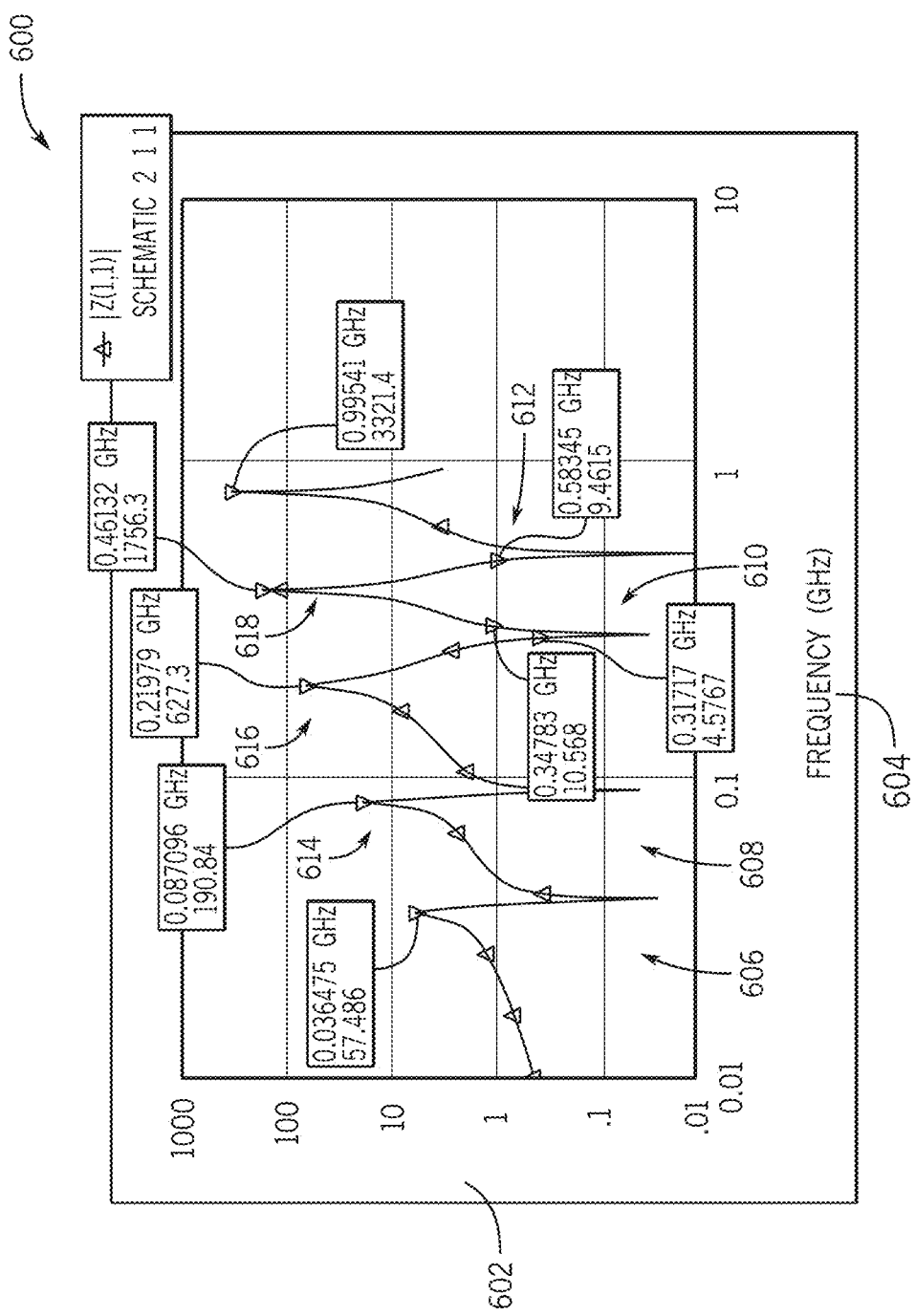
FIG. 6 is a graphical representation of an embodiment of tuning circuitry operation, in accordance with embodiments of the present disclosure.

FIG. 6 is a graphical representation of an embodiment of a plot 600 illustrating impedance versus frequency. The illustrated y-axis 602 corresponds to impedance (Z) in ohms and the x-axis 604 corresponds to frequency (f) in gigahertz (GHz). In the illustrated embodiment, the plot 600 includes values for a load applied to the tuning circuit 500 shown in FIG. 5. FIG. 6 illustrates five different peaks and four different valleys. As noted above, terminals of the circuit arrangement may lead to additional peaks. However, the peaks described with respect to FIG. 6 will be a result of the various branches shown in FIG. 5.

Illustrated in FIG. 6 are a first valley 606 corresponding to the first branch 506, a second valley 608 corresponding to the second branch 508, a third valley 610 corresponding to the third branch 510, and a fourth valley 612 corresponding to the fourth branch 512. These valleys 606, 608, 610, 612 are representative of low points on the plot (e.g., changes in direction from a negative slope to a positive slope). Each corresponding pair of valleys includes a peak. For example, a first peak 614 is arranged between the first and second valleys 606, 608, a second peak 616 is arranged between the second and third valleys 608, 610, and a third peak 618 is arranged between the third and fourth valleys 610, 612. As described above, these peaks may be utilized to determine an appropriate operational frequency for the antenna 504, thereby improving system operation.

As previously described with respect to FIG. 4, it can be seen that the peaks 614, 616, 618 include impedance values significantly greater than the valleys 606, 608, 610, 612. Accordingly, it is advantageous to operate at frequency associated with the peaks 614, 616, 618 to have high impedance operation, which also reduces current to improve SNR.

Figure 7:
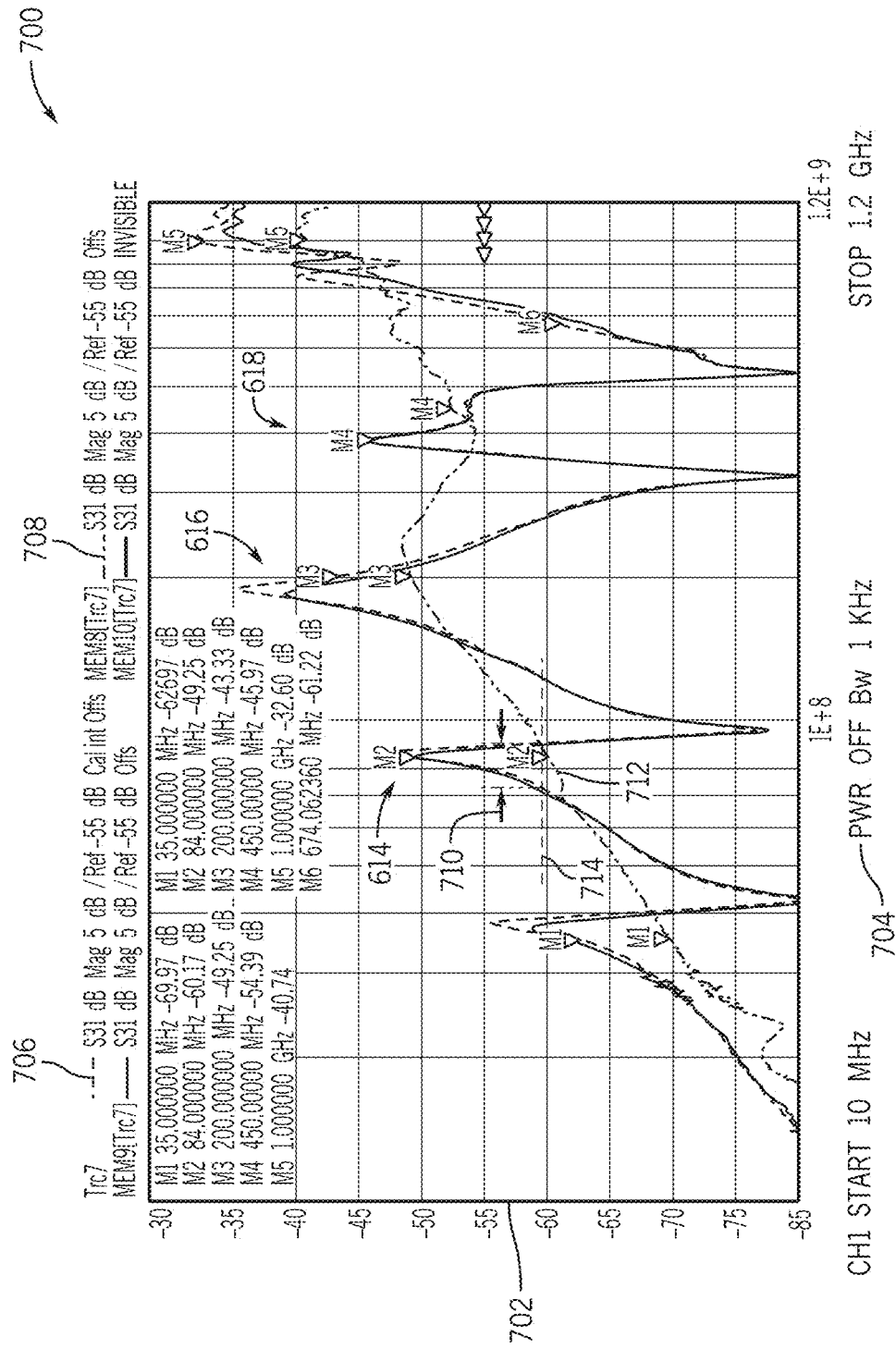
FIG. 7 is a graphical representation of a comparison between prior art methods and an embodiment of tuning circuitry, in accordance with embodiments of the present disclosure.

FIG. 7 is a graphical representation 700 illustrating a comparison of antenna signal strength when utilizing the multi-frequency tuning circuit compared to operation at designated frequencies. The illustrated plot includes the y-axis 702 corresponding to decibels (dB) and the x-axis 704 corresponding to frequency (f) in Hz. The plot 700 includes a two different measurements, a first plot 706 corresponds to operation at designated frequencies while a second plot 708 corresponds to use of the multi-frequency tuning circuit. As will be described below, at a variety of different measurement locations, the second plot 708 illustrates improved performance compared to the designated frequency model.

As described above with respect to FIGS. 4 and 6, FIG. 7 further illustrates the various peaks and valleys associated with utilizing the multi-frequency tuning circuit. For example, the illustrated plot corresponds to the circuit 500, thereby including the first, second, and third peaks 614, 616, 618 described above. As previously noted each of these peaks includes a respective range 710 that may correspond to a range of frequencies providing operation at an advantageous impedance. This tolerance enables easier component selections, because available LC combinations may have discrete values and combinations. Another benefit of the tolerance is that the electronic component values drift at higher downhole temperatures and the tolerance may improve the reliability of the equipment. The tolerance enables the tool to operate in different formations, which will affect antenna inductance due to different conductivity.

Turning to the first peak 614 and the associated traditional marker 712, the operation at the first peak 614 provides an improvement of approximately 11 dB. In this embodiment, the frequency is 35 MHz. However, it should be appreciated that the range 710A for the first peak 614 is larger, and as a result, a variety of different frequencies may be utilized while still providing improved performance over the traditional marker 712, as illustrated by the line 714. Similar relationships are shown for each of the second and third peaks 616, 618. Accordingly, embodiments provide a system and method to identify operating frequencies that provide improved performance while also decreasing SNR due to a reduction in current.

Figure 8:
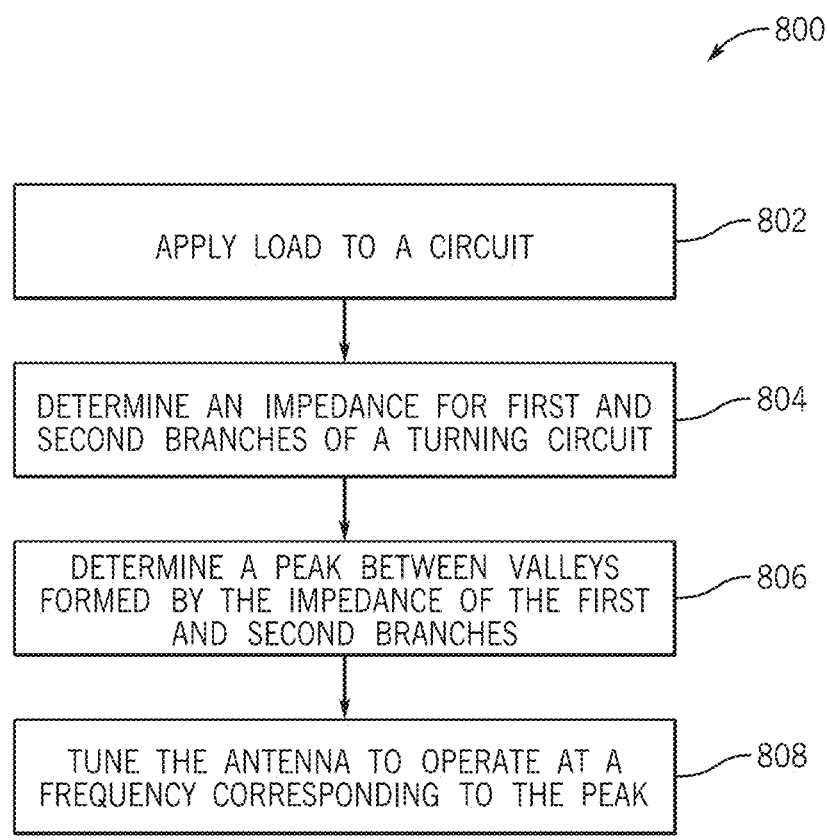
FIG. 8 is a flow chart of an embodiment of a method for creating a tuning circuit; in accordance with embodiments of the present disclosure.

FIG. 8 is a flow chart of an embodiment of a method 800 for determining an operational frequency for a downhole tool. It should be appreciated that this method, and all methods described herein, may include more or fewer steps. Moreover, the steps may be performed in any order, or in parallel, unless otherwise specifically stated. This example begins by applying a load to a circuit 802. For example, the circuit may include the PA, a tuning circuit, and an antenna, such as the configuration shown in FIG. 5. Impedance is determined for at least two branches of a tuning circuit 804. For example, the tuning circuit may include branches including LC circuits that return an impedance measurement at particular frequencies. As described above, there may be a peak formed between valleys associated with the impedance of the valleys, which may be determined 806. The peak, in various embodiments, corresponds to a high level of impedance at a particular frequency. Upon determining the peak, an antenna may be tuned to operate at the frequency associated with the peak and/or within a range of that frequency associated with the peak 808. In this manner. The antenna may be tuned using a multi-frequency tuning circuit.

Figure 9:
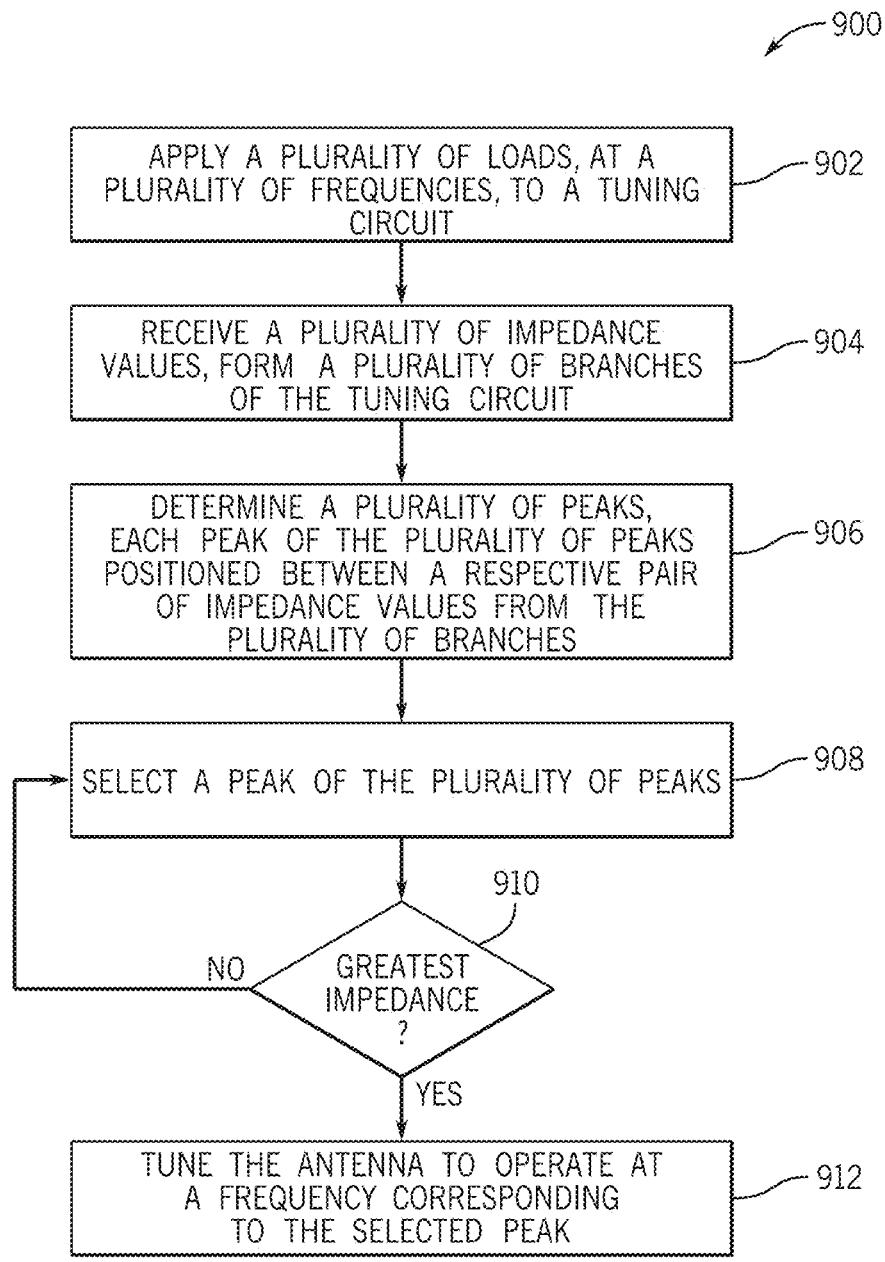
FIG. 9 is a flow chart of an embodiment of a method for creating a tuning circuit, in accordance with embodiments of the present disclosure.

FIG. 9 is an embodiment of a method 900 for selecting a frequency for an antenna. This example begins by applying a plurality of loads to a tuning circuit 902. In certain embodiments, the loads are applied at different frequencies. It should be appreciated that the loads may be provided simultaneously, semi-simultaneously, sequentially, at intervals, or any combination thereof. Impedance values are received from a plurality of branches associated with the tuning circuit 904. For example, in various embodiments, the tuning circuit may include a series of branches having AC circuits. The branches may be arranged in parallel and be responsive to the loads at different frequencies. The values are used to determine a series of peaks 906. The peaks correspond to high impedance values compared to surrounding valleys for the branches. A peak is selected 908 and evaluated to determine whether the peak has the greatest impedance 910. If not, a new peak is selected. If it does, that peak is selected and its corresponding frequency is used to tune the antenna 912.

Figure 10:
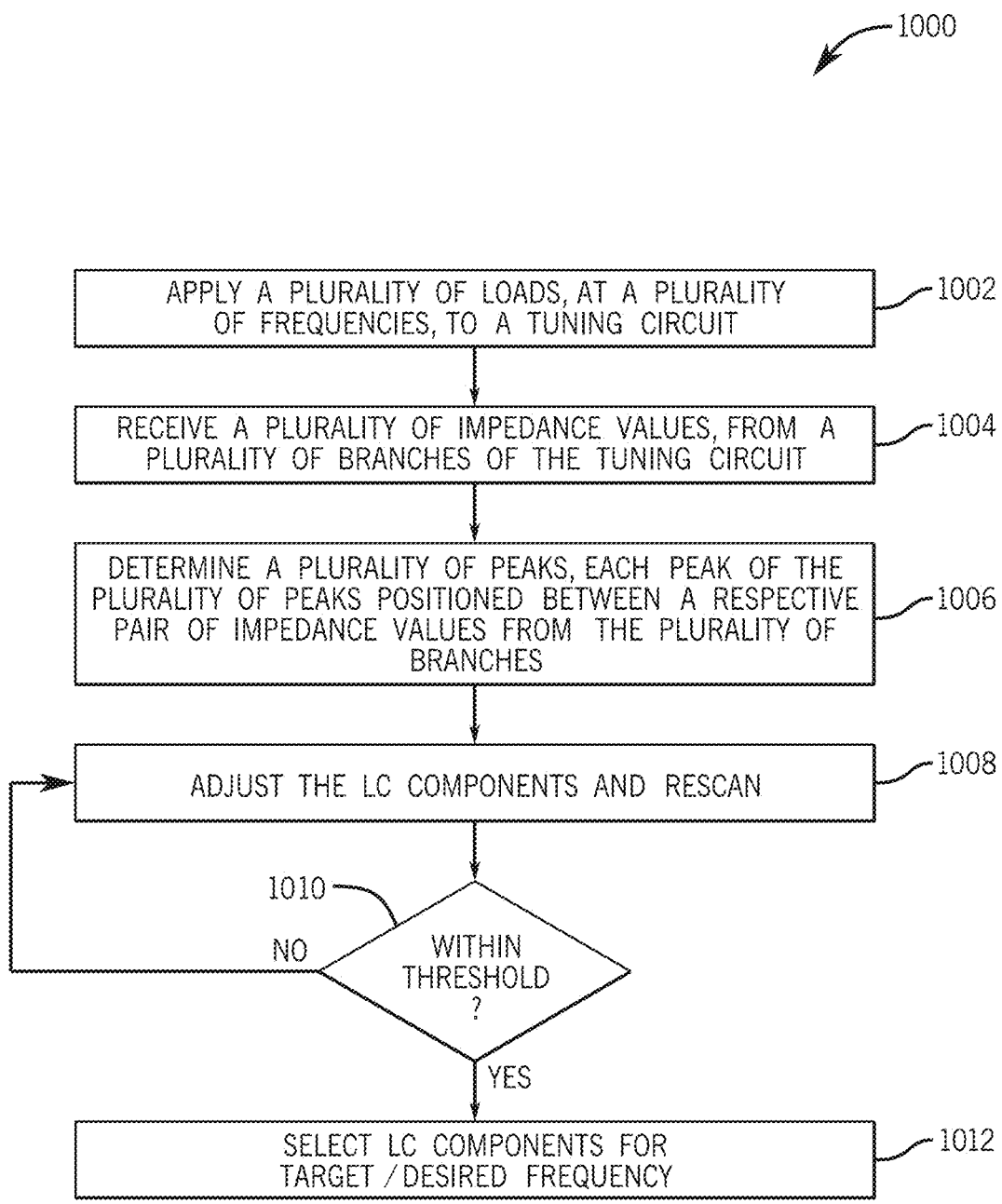
FIG. 10 is a flow chart of an embodiment of a method for selecting components for a tuning circuit, in accordance with embodiments of the present disclosure.

FIG. 10 is an embodiment of a method 1000 for selecting components for use in a tuning/matching circuit. This example begins by applying a plurality of loads to a tuning circuit 1002. In certain embodiments, the loads are applied at different frequencies. It should be appreciated that the loads may be provided simultaneously, semi-simultaneously, sequentially, at intervals, or any combination thereof. Impedance values are received from a plurality of branches associated with the tuning circuit 1004. For example, in various embodiments, the tuning circuit may include a series of branches having AC circuits. The branches may be arranged in parallel and be responsive to the loads at different frequencies, based on the components utilized to for various LC circuits. The values are used to determine a series of peaks 1006. The peaks correspond to high impedance frequencies compared to surrounding valleys for the branches. Components of the LC circuits are then adjusted 1008 and the circuit impedance is scanned 1010. For example, one or more of the components may be altered to change properties of the circuit. Scanning may also include applying a load to the circuit. The resultant impedance is then evaluated against a target or desired frequency 1010. For example, the resultant impedance may be evaluated to determine whether it falls within a threshold for the target or desired frequency. If not, the LC components may be adjusted again. If it does, those components may be selected for use at the target or desired frequency.

Embodiments of the present disclosure may provide benefits over existing systems to facilitate improved operations for downhole tools, such as tools that utilize antennas. The tuning circuit of the present disclosure may provide improved power transmission, enable multi-frequency design, and improve SNR. Furthermore, the tuning circuit may enable the antenna to work at a peak of an impedance spectra. Each peak, which may be identified using embodiments of the present disclosure with an associated bandwidth, thereby providing a tolerance for component selection and operation. Accordingly, a wider range of components may be available. Furthermore, operations at elevated downhole temperatures, which may change certain values due to thermal drift, may not alter the design outside of the range. Additionally, operations in different formations may be conducted due to the wider tolerance, even when different formations affect antenna inductance due to different conductivity.

The foregoing disclosure and description of the disclosed embodiments is illustrative and explanatory of various embodiments of the present disclosure. Various changes in the details of the illustrated embodiments can be made within the scope of the appended claims without departing from the true spirit of the disclosure. The embodiments of the present disclosure should only be limited by the following claims and their legal equivalents.

The invention claimed is:

1. A system for tuning a frequency, comprising:
an antenna;
a source for providing operational energy to the antenna;
a tuning circuit positioned in series between the antenna and the source, the tuning circuit configured to identify one or more high impedance operational frequencies for the antenna, the tuning circuit comprising:
a first branch including a first inductor and a first capacitor arranged in series; and
a second branch including a second inductor and a second capacitor arranged in series; and
a downhole tool, comprising an instrument module associated with the source and the antenna, wherein the tuning circuit is removable from the downhole tool and configured to identify the one or more high impedance operational frequencies before the downhole tool is positioned within a wellbore.

2. The system of claim 1, wherein the first inductor has a different inductance than the second inductor.

3. The system of claim 2, wherein the first capacitor has a different capacitance than the second capacitor.

4. The system of claim 1, wherein the first and second branches are arranged in parallel with respect to one another.

5. The system of claim 1, wherein a first load at a first frequency is transmitted toward the antenna, the first load being received at the first branch, a second load at a second frequency is transmitted toward the antenna, the second load being received at the second branch, and resultant respective impedance values are obtained from each of the first branch and the second branch to identify a peak impedance, arranged between the resultant respective impedance values.

6. The system of claim 1, wherein the antenna is turned to operate at a selected operational frequency of the one or more high impedance operational frequencies, the selected operational frequency having an impedance above an impedance threshold.

7. The system of claim 1, wherein components of at least one of the first branch or the second branch are adjusted to operate within a threshold impedance at a target frequency.

8. The system of claim 1, further comprising:
a measurement receiver configured to determine a respective impedance value at the first branch and the second branch, the measurement receiver correlating the respective impedance value with an operational frequency associated with an applied load.

9. A method for selecting an operational frequency, comprising:
positioning a tuning circuit between a source and an antenna;
applying a first load to a first branch of the tuning circuit;
determining a first impedance of the first branch at the first load;
applying a second load to a second branch of the tuning circuit;
determining a second impedance of the second branch at the second load;
identifying a peak between the first impedance and the second impedance, the peak having a peak impedance greater than both the first impedance and the second impedance and being at a peak frequency; and
tuning the tuning circuit to operate at a selected frequency within a range of the peak frequency.

10. The method of claim 9, wherein the first load is applied at a first frequency and the second load is applied at a second frequency.

11. The method of claim 9, further comprising:
adjusting one or more components forming at least one of the first branch or the second branch;
comparing an adjusted impedance against the peak impedance; and
determining the adjusted impedance is within a threshold of the peak impedance.

12. The method of claim 9, further comprising:
positioning the first branch parallel to the second branch; and
positioning both the first branch and the second branch parallel to the antenna.

13. The method of claim 9, further comprising:
identifying the range, the range covering a plurality of frequencies having respective impedances greater than both the first impedance and the second impedance.

\* \* \* \* \*